United States Patent
Noh et al.

(10) Patent No.: US 12,451,421 B2
(45) Date of Patent: Oct. 21, 2025

(54) SEMICONDUCTOR DEVICE WITH DOUBLE ETCH STOP LAYER AND METHOD OF MANUFACTURING THE SAME

(71) Applicant: SAMSUNG ELECTRONICS CO., LTD., Suwon-si (KR)

(72) Inventors: Sunyoung Noh, Suwon-si (KR); Euibok Lee, Suwon-si (KR); Wandon Kim, Seongnam-si (KR); Minjoo Lee, Suwon-si (KR); Hyunbae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 601 days.

(21) Appl. No.: 17/535,818

(22) Filed: Nov. 26, 2021

(65) Prior Publication Data

US 2022/0230956 A1  Jul. 21, 2022

(30) Foreign Application Priority Data

Jan. 18, 2021  (KR) .................. 10-2021-0006701

(51) Int. Cl.
  *H01L 23/522* (2006.01)
  *H01L 23/528* (2006.01)

(52) U.S. Cl.
  CPC ........ *H01L 23/5226* (2013.01); *H01L 23/528* (2013.01)

(58) Field of Classification Search
  CPC ..................... H01L 23/5226; H01L 23/528
  USPC ........................................................ 257/774
  See application file for complete search history.

(56) References Cited

U.S. PATENT DOCUMENTS

| | | |
|---|---|---|
| 8,987,133 B2 | 3/2015 | Nguyen et al. |
| 9,412,648 B1 | 8/2016 | Shiu et al. |
| 10,475,739 B2 | 11/2019 | You et al. |
| 2016/0049364 A1 | 2/2016 | Edelstein et al. |
| 2016/0372413 A1* | 12/2016 | Mahalingam ..... H01L 21/76832 |
| 2019/0013236 A1 | 1/2019 | LiCausi et al. |
| 2019/0043803 A1* | 2/2019 | You ................... H01L 23/53295 |
| 2019/0295890 A1 | 9/2019 | Clark et al. |
| 2020/0105664 A1 | 4/2020 | Han et al. |
| 2020/0135562 A1 | 4/2020 | Chen et al. |
| 2021/0005548 A1* | 1/2021 | Lee ................... H01L 21/76832 |
| 2021/0005551 A1* | 1/2021 | Lee ................... H01L 21/76832 |

(Continued)

*Primary Examiner* — Norman D Richards
*Assistant Examiner* — Laura M Dykes
(74) *Attorney, Agent, or Firm* — Morgan, Lewis & Bockius LLP

(57) ABSTRACT

A semiconductor device includes a substrate with an active region, a first interlayer insulating layer on the substrate, a first wiring in the first interlayer insulating layer that is electrically connected to the active region, an insulating pattern on the first interlayer insulating layer and that has a first opening exposing the first wiring, a double etch stop layer having lower and upper etch stop patterns on the insulating pattern and the first wiring, and including a second opening exposing a portion of the first wiring, a second interlayer insulating layer on the upper etch stop pattern and having a via hole connected to the second opening, the via hole having a rounded top corner region, a second wiring in the second interlayer insulating layer, and a via connecting the portion of the first wiring and the second wiring through the second opening and the via hole.

17 Claims, 16 Drawing Sheets

(56) References Cited

U.S. PATENT DOCUMENTS

| | | | |
|---|---|---|---|
| 2022/0157711 A1* | 5/2022 | Lee | H01L 21/76834 |
| 2023/0138988 A1* | 5/2023 | Motoyama | H01L 23/5226 |
| | | | 257/774 |

* cited by examiner

II - II'

SEMICONDUCTOR DEVICE WITH DOUBLE ETCH STOP LAYER AND METHOD OF MANUFACTURING THE SAME

CROSS-REFERENCE TO RELATED APPLICATION(S)

This U.S. nonprovisional application claims priority under 35 U.S.C § 119 to Korean Patent Application No. 10-2021-0006701 filed on Jan. 18, 2021 in the Korean Intellectual Property Office, the entire disclosure of which is incorporated by reference herein in its entirety.

TECHNICAL FIELD

Embodiments of the inventive concept relate to a semiconductor device and a method of manufacturing the same.

DISCUSSION OF THE RELATED ART

The fabrication of semiconductor devices includes Front End of Line (FEOL) processes and Back End of Line (BEOL) processes. The FEOL processes are performed first, and include the fabrication of individual components such as transistors, capacitors, and resistors. The BEOL processes are performed after the FEOL processes, and include wiring the components together using wires and vias which are created with metal fills.

Recently, users have demanded semiconductor devices with high integration, reduced size, and low power consumption. As devices become more integrated, the spacing between circuit components such as wiring or the like is gradually reduced. Accordingly, there have been studies into improvements in the BEOL processes to enable the increase in integration while increasing reliability.

SUMMARY

Embodiments of the present disclosure provide a semiconductor device having wiring having increased reliability.

Embodiments of the present disclosure also provide a method of manufacturing a semiconductor device having a wiring having increased reliability.

According to example embodiments, a semiconductor device includes a substrate including an active region; a first interlayer insulating layer disposed on the substrate, a first wiring disposed in the first interlayer insulating layer and electrically connected to the active region, an insulating pattern disposed on the first interlayer insulating layer and including a first opening, where the first opening exposes the first wiring, a double etch stop layer including a lower etch stop pattern and an upper etch stop pattern, where the lower etch stop pattern and the upper etch stop pattern are sequentially disposed on the insulating pattern and the first wiring, and where the double etch stop layer includes a second opening that exposes a portion of the first wiring through the first opening, a second interlayer insulating layer disposed on the upper etch stop pattern and including a via hole connected to the second opening, the via hole including a rounded top corner region, a second wiring disposed in the via hole above the first wiring and within the second interlayer insulating layer, and a via connecting the portion of the first wiring and the second wiring to each other through the second opening and the via hole.

According to example embodiments, a semiconductor device includes a substrate including a first wiring, where the first wiring extends in a first direction, an insulating pattern disposed on the substrate and including a first opening which exposes the first wiring, a double etch stop layer including a lower etch stop pattern and an upper etch stop pattern sequentially stacked on the insulating pattern and the first wiring, and wherein the double etch stop layer includes a second opening which exposes a portion of the first wiring through the first opening, an interlayer insulating layer disposed on the upper etch stop pattern, wherein the interlayer insulating layer includes a via hole connected to the second opening, the via hole including a rounded top corner region, a via connected to the exposed portion of the first wiring through the second opening and the via hole, wherein the via is disposed on an upper surface of the insulating pattern and has a stepped structure, and a second wiring disposed in the via hole above the first wiring and within the interlayer insulating layer, and extending in a second direction, wherein the second direction intersects the first direction.

According to example embodiments, a method of manufacturing a semiconductor device includes forming a first wiring on a substrate, forming an insulating pattern on the first wiring, forming an opening in the insulating pattern that exposes the first wiring, sequentially forming a lower etch stop layer and an upper etch stop layer on the insulating pattern and the first wiring, forming an interlayer insulating layer on the upper etch stop layer, forming a hard mask pattern on the interlayer insulating layer, performing a first etching process using the hard mask pattern, wherein the first etching process forms a via hole connected to a portion of the opening in the interlayer insulating layer, and wherein the hard mask pattern is removed during the first etching process, performing a second etching process such that a top corner portion of the via hole is rounded in the interlayer insulating layer, and wherein a region of the upper etch stop layer exposed by the via hole is removed during the second etching process, exposing a portion of the first wiring by removing a region of the lower etch stop layer exposed by the via hole after the second etching process, and forming a second wiring including a via connected to the portion of the first wiring through the via hole.

BRIEF DESCRIPTION OF THE DRAWINGS

The above and other aspects and features of the present disclosure will be more clearly understood from the following detailed description of embodiments thereof, taken in conjunction with the accompanying drawings, in which.

DETAILED DESCRIPTION OF THE EMBODIMENTS

Figure 1:
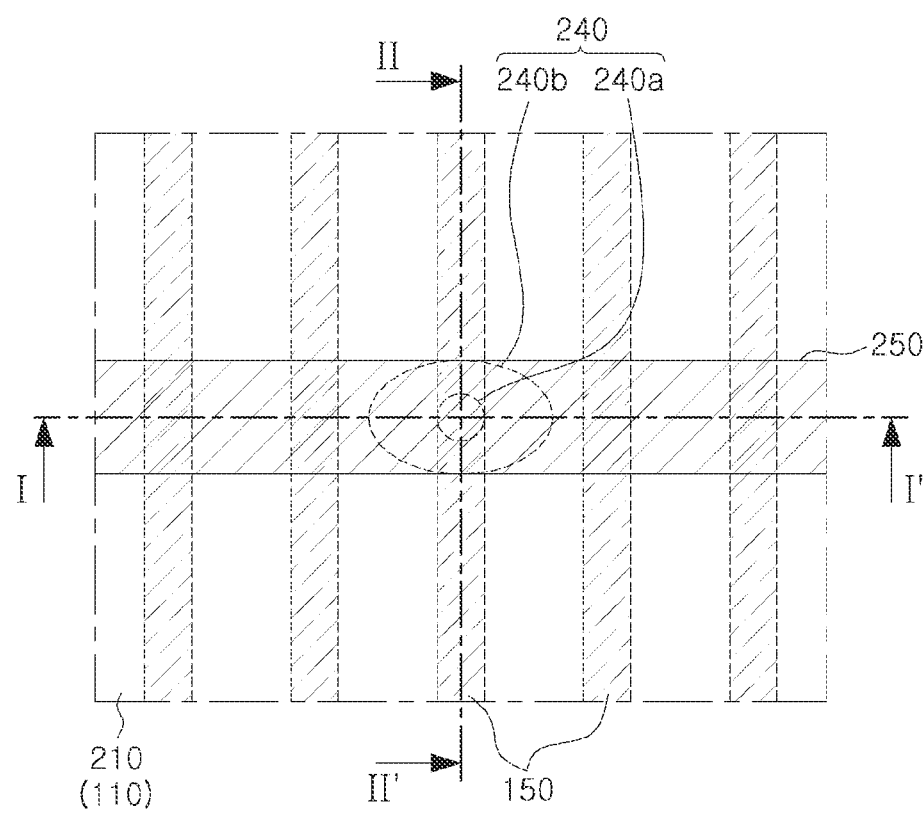
FIG. 1 is a schematic plan view that illustrates a semiconductor device according to example embodiments.

Hereinafter, example embodiments will be described in detail with reference to the accompanying drawings. Like reference numerals may refer to like components, and to the extent that a description of an element has been omitted, it may be understood that the element is at least similar to corresponding elements that are described elsewhere in the specification.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art.

Figure 2:
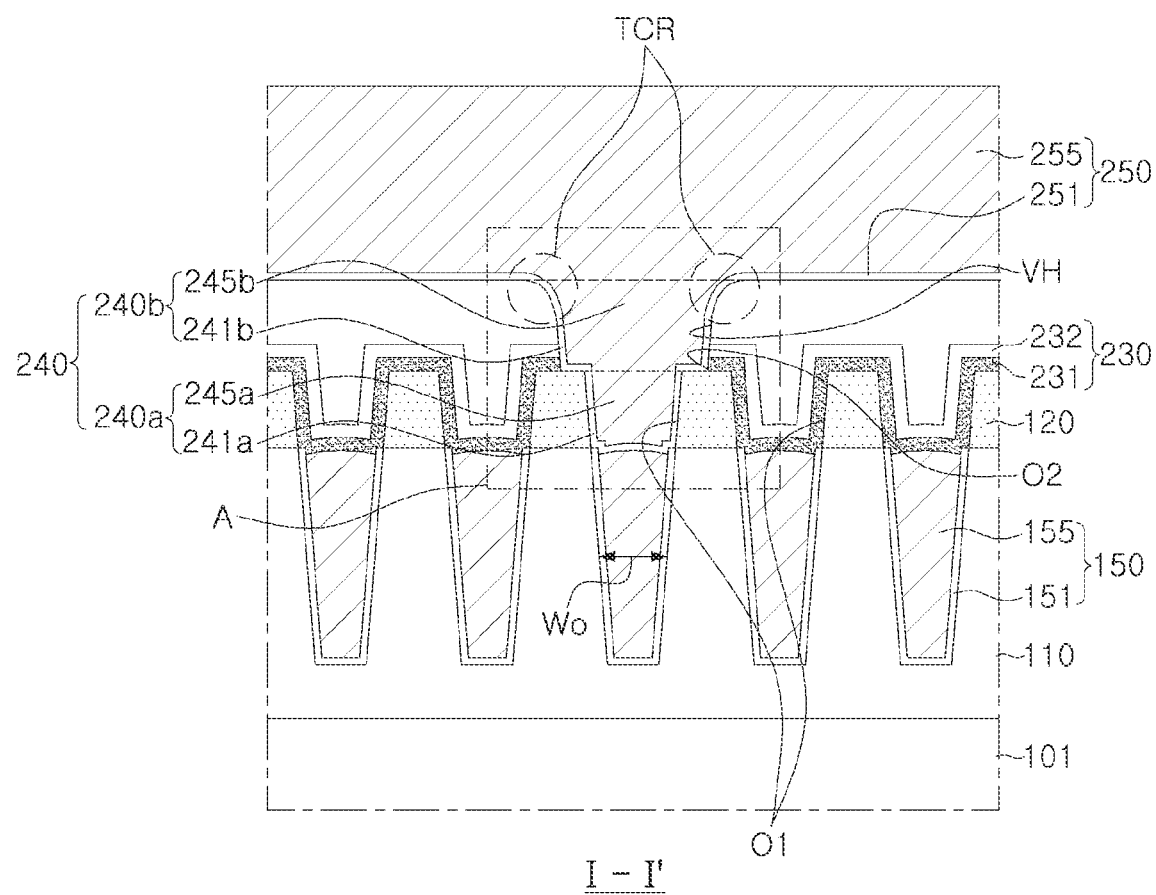
FIGS. 2 and 3 are cross-sectional views of the semiconductor device of FIG. 1, taken along lines I-I' and respectively.
Figure 3:
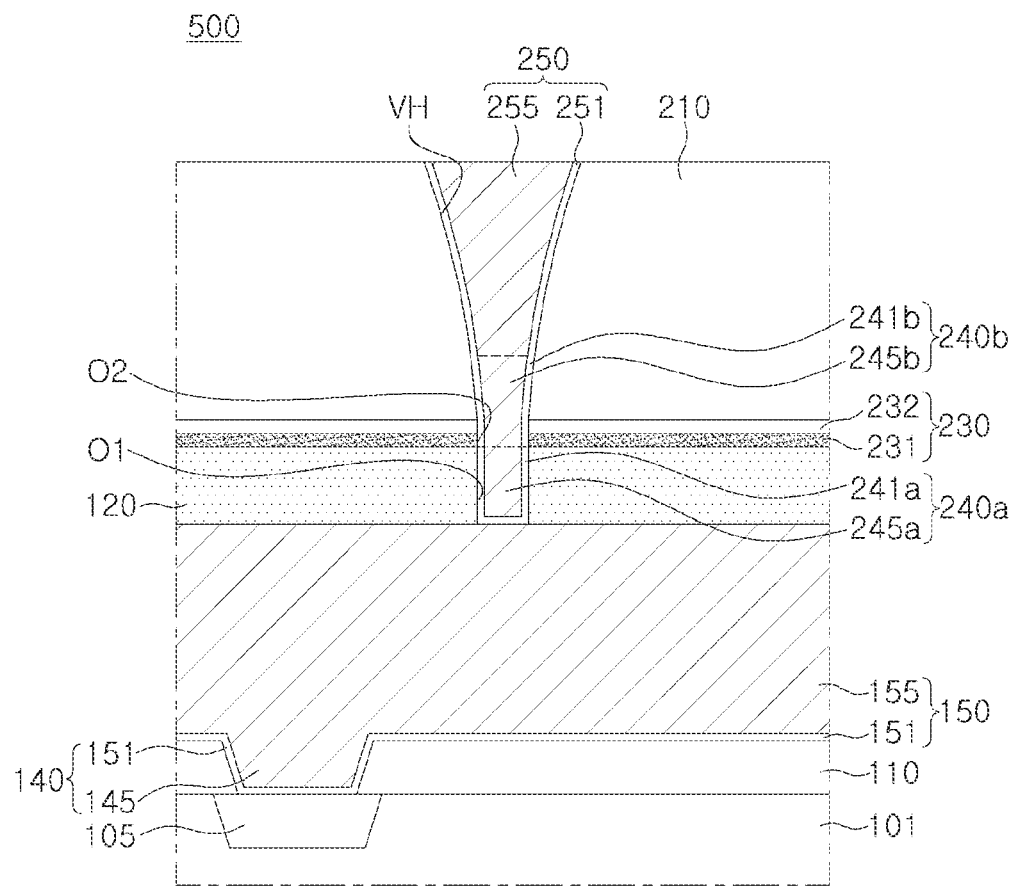

FIG. 1 is a schematic plan view that illustrates a semiconductor device according to example embodiments, and FIGS. 2 and 3 are cross-sectional views of the semiconductor device of FIG. 1, taken along lines I-I' and Referring to FIGS. 1 to 3, a semiconductor device 500 according to an example embodiment may include a substrate 101 with an active region (105 in FIG. 3), a lower wiring 150 connected to the active region 105, an etch stop layer 230 with double layers 231 and 232, a via 240 connected to the lower wiring 150 through the etch stop layer 230, and an upper wiring 250 disposed on the via 240. The lower wiring 150 may be a "first wiring" of the semiconductor device 500, and the upper wiring 250 may be a "second wiring" of the semiconductor device 500.

In some embodiments, as illustrated in FIG. 1, the upper wiring 250 and the lower wiring 150 may extend in directions that intersect each other. For example, the upper wiring 250 may extend in a first direction D1, and the lower wiring 150 may extend in a second direction D2 substantially perpendicular to the first direction D1. For example, the first and second directions D1 and D2 may be substantially parallel to the upper surface of the substrate 101. The via 240 may extend in a third direction D3 that is substantially perpendicular to the first and second directions D1 and D2 in a region where the upper wiring 250 and the lower wiring 150 overlap. Details of the upper wiring 250, the lower wiring 150, and the via 240 will be described later.

In an embodiment, the substrate 101 may have a structure including a base substrate and an epitaxial layer grown on the base substrate, but the structure of the substrate 101 is not necessarily limited thereto. The substrate 101 may include a semiconductor such as Si or Ge, or a compound semiconductor such as SiGe, SiC, GaAs, InAs, or InP. In an embodiment, the substrate 101 may have a silicon-on-insulator (SOI) structure.

The substrate 101 may include the active region 105 in which a plurality of devices such as transistors are formed. The active region 105 may be a conductive region, and may be doped with varying concentrations of impurities according to various embodiments. For example, the active region 105 may be an n-type well for a PMOS transistor or a p-type well for an NMOS transistor. In a detailed embodiment, the active region 105 may include an active fin protruding in the third direction D3.

In some embodiments, as illustrated in FIGS. 2 and 3, the lower wiring 150 may be disposed in a first interlayer insulating layer 110 above the substrate 101. The lower wiring 150 may include a via 140 connected to the active region 105. In some embodiments, the via 140 of the lower wiring may be connected to the active region 105 and connected to a contact structure extending in the third direction D3.

In some embodiments, the substrate 101 may include the lower wiring 150. The lower wiring 150 has been described as a metal wiring in example embodiments, but the material is not necessarily limited thereto. The lower wiring 150 may include electrodes of transistors and diodes (e.g., a gate electrode and/or source/drain electrodes) in the substrate 101.

In an embodiment, the lower wiring 150 may include a first barrier layer 151 and a first conductive material 155. The first barrier layer 151 may be formed along a side surface and a bottom surface of the trench formed in the first interlayer insulating layer 110. While the drawings illustrate the first barrier layer 151 as a single layer, the first barrier layer 151 may include a plurality of layers. For example, the first barrier layer 151 may include one or more layers of tantalum, tantalum nitride, titanium, titanium nitride, ruthenium, cobalt, nickel, nickel boron (NiB), and tungsten nitride, but the material included therein is not necessarily limited thereto.

The first conductive material 155 may include the same conductive material that is disposed in the trench where the first barrier layer 151 is formed. For example, the first conductive material 155 may include one or more of aluminum (Al), copper (Cu), tungsten (W), cobalt (Co), and combinations thereof.

The semiconductor device 500 according to an embodiment may include an insulating pattern 120 disposed on the first interlayer insulating layer 110. The insulating pattern 120 may include first openings O1 which expose respective lower wirings 150. The insulating pattern 120 may prevent or reduce process defects due to a decrease in overlay align margins in a lithography process of forming a via hole VH, and/or may suppress the occurrence of deterioration such as time dependent dielectric breakdown (TDDB) due to the reduction of the short margin between the lower wiring 150 and the via 240. The insulating pattern 120 may also secure a reduced distance between the lower wiring 150 and the via 240 positioned thereon. The first openings O employed in an embodiment may be trenches that expose the upper surface of the lower wiring 150 in the second direction D2, respectively, but the configuration is not necessarily limited thereto. Openings of various other shapes may be included.

The insulating pattern 120 may include a material with a relatively low dielectric constant deposited on the upper surface of the first interlayer insulating layer 110. For example, the insulating pattern 120 may include fluorinedoped silicon oxide (SiOF), carbon-doped silicon oxide (SiOCH), porous silicon oxide, an inorganic polymer such as hydrogen silsesquioxane (HSSQ) or methyl silsesquioxane (MSSQ), or a spin-on organic polymer. The insulating pattern 120 may be an upper region of the first interlayer insulating layer 110, and an element that corresponds to the first opening O1 may be a trench structure obtained by recessing a partial region of the lower wiring 150 (refer to FIGS. 6 and 7 and FIGS. 9A to 9C).

The etch stop layer 230 may include a lower etch stop pattern 231 and an upper etch stop pattern 232 which are both sequentially disposed on the insulating pattern 120 and the lower wiring 150. The lower etch stop pattern 231 and the upper etch stop pattern 232 may include different materials to have different etch selectivity. In some embodiments, the lower etch stop pattern 231 may include an aluminum compound, and the upper etch stop pattern 232 may not include the aluminum compound. For example, the lower etch stop pattern 231 may include aluminum oxide, aluminum nitride, aluminum oxynitride, or aluminum oxide carbide, and the upper etch stop pattern 232 may include silicon oxide carbide, silicon oxynitride, or silicon carbide nitride. For example, in an embodiment, the lower etch stop pattern 231 may include aluminum oxide, and the upper etch stop pattern 232 may include oxygen doped silicon carbide (ODC).

As described above, the etch stop layer 230 employed in an embodiment is comprised of only two layers, and the total thickness of the etch stop layer 230 may be thinner than other multilayers structures (e.g., triple layers). As the semiconductor device scales down, the width of the first opening O1 of the insulating pattern 120 in the first direction D1 is relatively narrowed. Therefore, in a comparative example where etch stop layer 230 is relatively thick, the first opening O1 may be almost filled with the etch stop layer 230 which may cause an incomplete metal filling in a later process, or a seam defect may occur in the first opening O1 during a deposition process. For example, since the width of the first opening O1 is determined by the width of the lower wiring 150 in the first direction D1, the reliability of the semiconductor device may decrease as a width W0 of the lower wiring 150 decreases. The width W0 of the lower wiring 150 may be defined as the width of the lower wiring 150 at its intermediate height.

Accordingly, by using the double etch stop layer 230 as described in an embodiment, even when the width W0 of the lower wiring 150 is about 15 nm or less, for example about 10 nm or less, the above-described reliability issue may be reduced. In some embodiments, the total thickness of the double etch stop layer 230 may be about 7 nm or less, for example about 5 nm or less. The thickness of each of the lower etch stop pattern 231 and the upper etch stop pattern 232 may be about 2 nm to 5 nm.

A second interlayer insulating layer 210 may be disposed on the upper etch stop pattern 232. The second interlayer insulating layer 210 may include another material having an etch selectivity with respect to the upper etch stop pattern 232. For example, the second interlayer insulating layer 210 may include at least one of, for example, silicon oxide, silicon nitride, silicon oxynitride, and a low dielectric constant material.

Referring to FIG. 2, the upper wiring 250 and the via 240 may be formed in the second interlayer insulating layer 210 and the etch stop layer 230. The via 240 may be connected to a portion of the lower wiring 150 through the first opening O1, thereby electrically connecting the upper wiring 250 to the lower wiring 150. The hole VH (also referred to as a "via hole") for the via 240 may penetrate through the second interlayer insulating layer 210 and the etch stop layer 230 to expose a portion of the lower wiring 150. The etch stop layer 230 has a second opening (O2) substantially defined by the via hole (VH), and the second opening (O2) may be connected to a portion of the lower wiring 150 through the first opening (O1). In an embodiment, the second opening O2 may be extended to open to an upper surface area of the insulating pattern 120 adjacent to the via 240.

The upper wiring 250 and the via 240 may include second barrier layers 241a, 241b and 251 disposed along the bottom and sidewalls of the via hole VH and the trench, and second conductive materials 245a, 245b and 255 disposed on the second barrier layers 241a, 241b and 251 which fill the via hole VH and the trench. In some embodiments, the upper wiring 250 and the via 240 may be simultaneously formed using a dual damascene process. The upper wiring 250 and the via 240 may include the same material and may have an integrated structure. For example, first to third portions 241a, 241b, and 251 of the second barrier layer may be formed of the same material by the same process, and first to third portions 245a, 245b and 255 of the second conductive material may be formed of the same material by the same process. The second barrier layers 241a, 241b, and 251 are illustrated as a single layer, but may include a plurality of layers. For example, the second barrier layers 241a, 241b, 251 may include, for example, at least one of tantalum, tantalum nitride, titanium, titanium nitride, ruthenium, cobalt, nickel, nickel boron (NiB), and tungsten nitride. The first conductive materials 245a, 245b, and 255 may include, for example, at least one of aluminum (Al), copper (Cu), tungsten (W), cobalt (Co), and combinations thereof.

Figure 4:
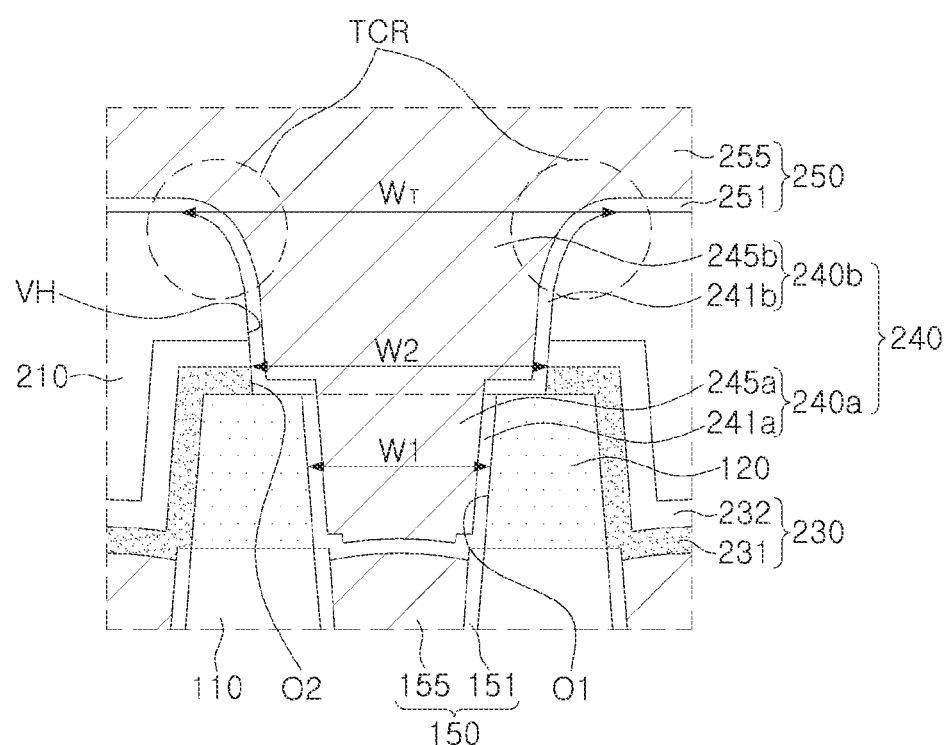
FIG. 4 is a partially enlarged view that illustrates portion "A" of the semiconductor device of FIG. 2.

The shape of the via 240 may be defined by the first and second openings O1 and O2 and the via hole VH. The via 240 has a first portion 240a surrounded by the insulating pattern 120 and a second portion 240b disposed on the first portion 240a. In an embodiment, the first portion 240a of the via is defined by the first opening O1 of the insulating pattern 120, and a width W2 of the second portion 240b may be greater than the width W1 of the first portion 240a (see FIG. 4). The second portion 240b of the via may have the width W2 that extends in a horizontal direction proximate to an upper surface area of the insulating pattern 120 exposed by the second opening O2. For example, the via 240 may have a stepwise structure (e.g., a discrete change in width) between the first portion 240a and the second portion 240b.

The via 240 may be partially surrounded by the double etch stop layer 230. For example, the via 240 may be partially surrounded by the double etch stop layer 230 near where the first portion 240a and the second portion 240b meet each other. The lower and upper etch stop patterns 231 and 232 surrounding the via 240 may directly contact the via 240.

In the trench formation process for the upper wiring 250 and the via 240 (see FIGS. 10B to 10D), a Top Corner Rounding (TCR) process may be performed on the upper portion of a second interlayer insulating layer 210 exposed from the formation of the trench. Through the TCR process, top corner regions of the second interlayer insulating layer 210, for example, top corner regions of the via hole VH, may be rounded. The rounded top corner region TCR may have an extended top width $W_T$ of the via hole VH. In an embodiment, the top of the via hole VH for the via 240 may extend in the direction D1 in the cross section illustrated in FIG. 2, and the top of the trench for the upper wiring 250 may extend in the direction D2 in the cross section illustrated in FIG. 3. As a result, the second conductive materials 245a, 245b, and 255 for the upper wiring 250 and the via 240 may be easily filled in the trench and the via hole VH.

When there is a partial region of the upper wiring 250, at least a portion of a rounded upper end portion may be removed by a planarization process in the final structure. In some embodiments, nearly all of the rounded upper end portion may be removed as illustrated in FIG. 3 (see FIG. 10F). The rounded portion TCR of the second interlayer insulating layer 210 adjacent to the via hole VH, e.g., a lower portion of the rounded portion TCR, may maintain its shape in the final structure. By contrast, the insulating pattern 120 not subjected to the TCR treatment may have an angular structure in a top corner region that is not rounded. In addition, in the process of etching the rounded top corner region TCR of the second interlayer insulating layer 210, the upper etch stop pattern 231 having a relatively low etching selectivity with respect to the second interlayer insulating layer 210 may also be etched. For example, the region of the upper etch stop pattern 231 exposed to the via hole VH in the TCR process may also be removed (see FIG. 10D).

In the semiconductor device 500 according to an embodiment, the round-processed structure (TCR) which decreases the difficulty of forming the via 240 and the upper wiring 250 may be employed together with the insulating pattern 120 for securing a reduced distance between the via 240 and the lower wiring 150. For example, even when the TCR structure is employed, by using the relatively thin two-layer etch stop layer 230, the reliability of a semiconductor device according to embodiments of the present disclosure may be increased by preventing or reducing occurrences where the first opening O1 is filled by a thicker etch stop layer and/or where seams are formed in the first opening O1, despite the critical dimension (CD) size reduction in the wiring.

An embodiment The above description applies to an embodiment where the via 240 is formed only in one (a first opening located in the center) of the plurality of first openings O1, but additional vias and upper wirings may also be formed in other first openings. For example, similarly to the via 240 and the upper wiring 250, other upper wirings and other vias may also be formed in other positions of the other first openings in the second direction.

Figure 5:
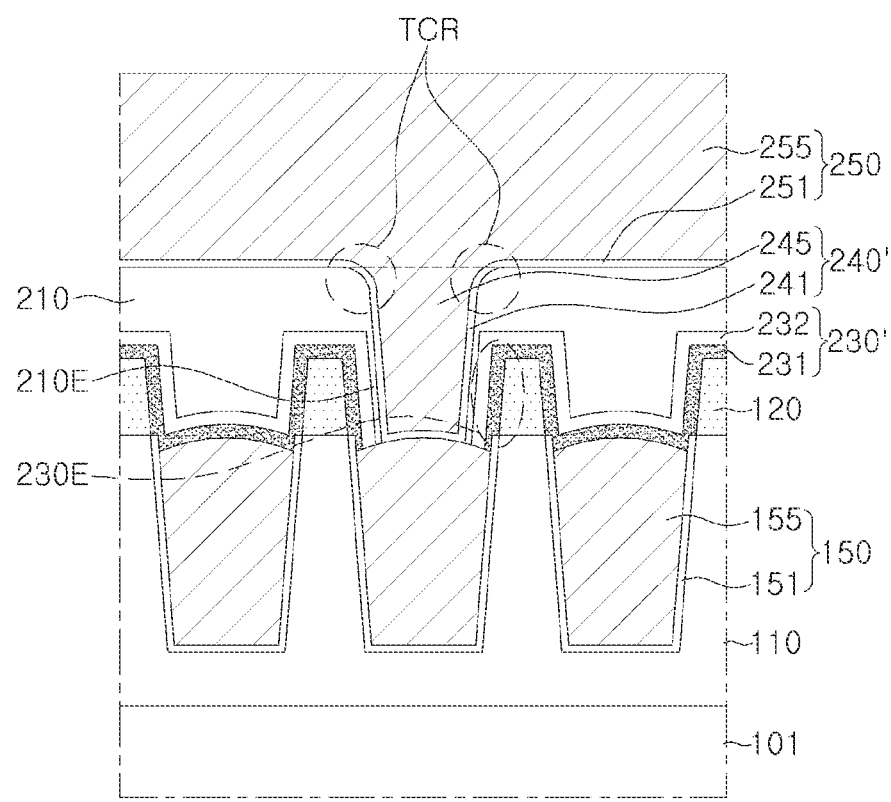
FIG. 5 is a cross-sectional view that illustrates a semiconductor device according to an example embodiment.

FIG. 5 is a cross-sectional view that illustrates a semiconductor device according to an example embodiment, and may be understood as a cross-section of a semiconductor device corresponding to the cross-section illustrated in FIG. 2.

Referring to FIG. 5, it may be understood that a semiconductor device 500A according to an example embodiment is similar to the example embodiment illustrated in FIGS. 1 to 4, except in that a via 240' does not have a stepped structure. In addition, components of an embodiment may be understood with reference to descriptions of the same or similar components of the embodiments illustrated in FIGS. 1 to 4 unless otherwise specified.

Similar to the previous embodiment, the semiconductor device 500A may include a rounded corner area (TCR) that may reduce the difficulty of forming the via 240 and the upper wiring 250, together with an insulating pattern 120 for securing a reduced distance between the via 240 and the lower wiring 150. This structure of the semiconductor device 500A may be implemented using a double etch stop layer 230 formed of a lower etch stop pattern 231 and an upper etch stop pattern 232.

Unlike the via 240 of an embodiment according to FIG. 2, the via 240' employed in an embodiment according to FIG. 5 does not have a stepped structure, and has a shape with a constant taper. Depending on the structure of the via 240', surrounding components may be implemented differently from the semiconductor device 500 according to the previous embodiment.

In detail, as illustrated in FIG. 5, a double etch stop layer 230' may have an extended portion 230E extending along the sidewall of the first opening O1 and located around the via 240. The extended portion 230E of the double etch stop layer may surround the via 240'. In an embodiment, the extended portion 230E of the double etch stop layer surrounds the entire circumference of the via 240', but the configuration is not necessarily limited thereto, and may be configured to surround only a partial region. For example, with reference to the cross section of FIG. 5, a left area of the via may have a structure in which the via 240 illustrated in FIG. 2 is extended to the upper surface area of the insulating pattern 120, and a right area opposite to the left area may be surrounded by the extended portion of the double etch stop layer as in the via 240' of an embodiment.

In addition, the second interlayer insulating layer 210 may have an extended portion 210E extending between the extended portion 230E of the double etch stop layer and the via 240. In an embodiment, the extended portion 210E of the second interlayer insulating layer surrounds the entire circumference of the via 240, but the configuration is not necessarily limited thereto. For example the extended portion 210E of the second interlayer insulating layer may also be configured to partially surround the via 240.

Figure 6:
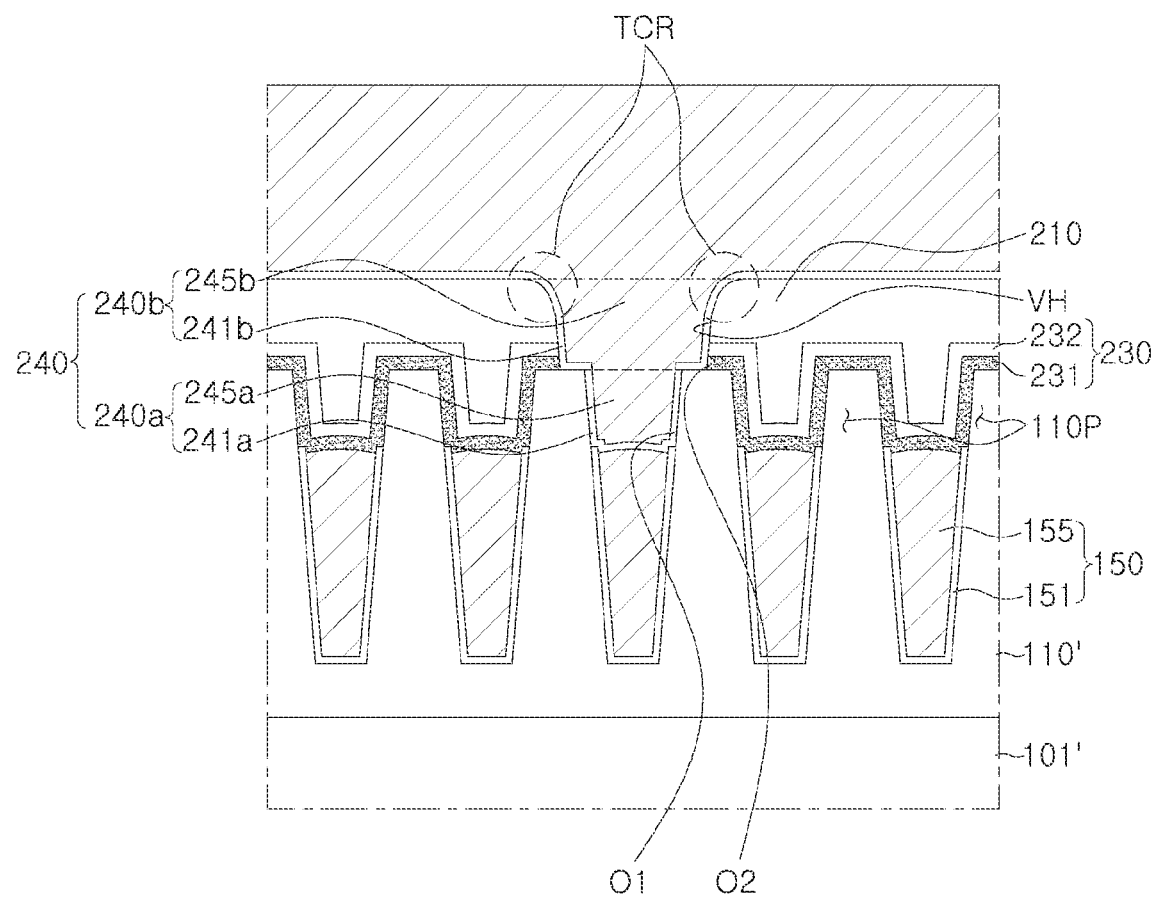
FIGS. 6 and 7 are cross-sectional views that illustrate a semiconductor device according to an example embodiment.
Figure 7:
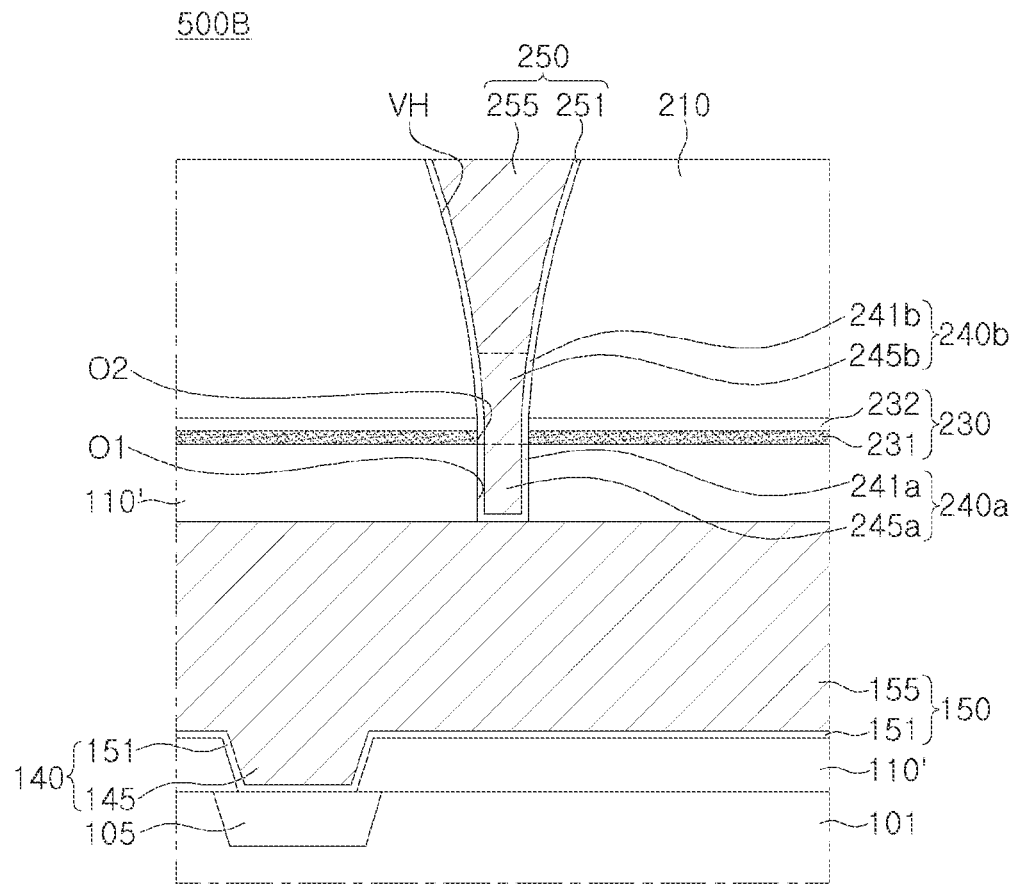

FIGS. 6 and 7 are cross-sectional views that illustrate a semiconductor device according to an example embodiment, and may be understood as cross-sections of a semiconductor device corresponding to the cross-sections illustrated in FIGS. 2 and 3, respectively.

Referring to FIGS. 6 and 7, a semiconductor device 500B according to an example embodiment may be similar to the example embodiment illustrated in FIGS. 1 to 4 except in that the insulating pattern disposed between upper regions of the trenches is a partial region of the first interlayer insulating layer 110. In addition, components of an embodiment may be understood with reference to descriptions of the same or similar components of the embodiments illustrated in FIGS. 1 to 4 unless otherwise specified.

Similar to the semiconductor device 500 according to the previous embodiment, the semiconductor device 500B may include an insulating pattern 110P for securing a reduced distance between a via 240 and a lower wiring 150, together with a second interlayer insulating layer 210 having a rounded corner region TCR. However, in an embodiment, the insulating pattern 110P with the first opening O1 includes the same material as the first interlayer insulating layer 110 and may be a portion of the first interlayer insulating layer 110. For example, the first opening O1 in an embodiment is not formed by patterning the deposited material after depositing an additional material (see FIGS. 8A to 8F), but is rather obtained by etching back the upper region of the lower wiring 150 in the trench (see FIGS. 9A to 9C).

Further, similar to the previous embodiment, the etch stop layer 230 has a second opening (O2), and the second opening (O2) may be connected to a partial region of the lower wiring 150 through the first opening (O1). In an embodiment, the second opening O2 may be widened to contact an upper surface area of the insulating pattern 110P adjacent to the via 240.

FIGS. 8A to 8F are cross-sectional views that illustrate major processes in a method of manufacturing a semiconductor device according to an example embodiment. The processes described with reference to FIGS. 8A to 8F may be included in a method of manufacturing the semiconductor device 500 illustrated in FIGS. 1 to 4.

As used herein, description of a singular component may be applied to a plurality of the same components, unless context indicates otherwise. For example, the description of the formation of a trench, a semiconductor component such as a gate, or the like, may apply to the formation of a plurality of the aforementioned elements.

Figure 8A:
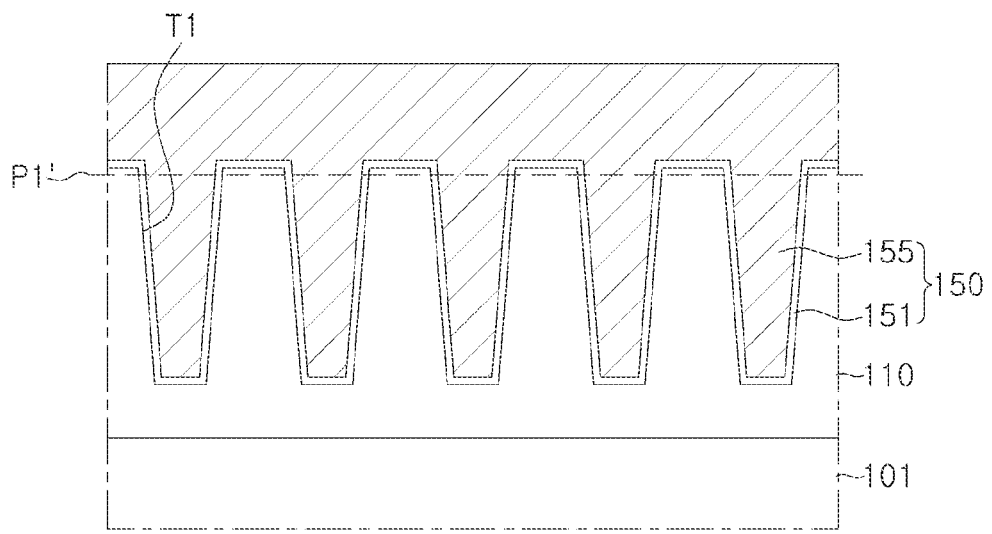
FIGS. 8A to 8F are cross-sectional views that illustrate major processes in a portion of a method of manufacturing a semiconductor device according to an example embodiment.

Referring to FIG. 8A, after forming a first interlayer insulating layer 110 on a substrate 101 and removing the first interlayer insulating layer 110 to form a first trench T1, a first barrier layer 151 may be formed and a first conductive material 155 for a lower wiring is filled in the first trench T1.

The substrate 101 may include a semiconductor material such as silicon, germanium, silicon-germanium or the like, or a III-V compound such as gallium phosphide (GaP), gallium arsenide (GaAs), gallium antimonide (GaSb), or the like. Contacts of various devices, for example, a gate structure, a source/drain, and a contact plug may be disposed on the substrate 101, and may be covered by an insulating layer formed between the substrate 101 and the first interlayer insulating layer 110.

The first interlayer insulating layer 110 may include a material with a relatively low dielectric constant. The first trench T1 may be formed at least on an upper portion of the first interlayer insulating layer 110, and may penetrate through the first interlayer insulating layer 110 in some cases. In this case, the first trench T1 may expose contact areas of the device formed below the first interlayer insulating layer 110, and the exposed contact areas will electrically connect the devices formed below the first interlayer insulating layer 110 to the lower wiring 150 filling the first trench T1.

The lower wiring 150 may include a first barrier layer 151 and a first conductive material 155. The first barrier layer 151 may be formed conformally to the inner wall and the bottom surface of the first trench T1, and the first conductive material 155 may be formed to fill the first trench T1. For example, the first conductive material 155 may be disposed on the first barrier layer 151.

Figure 8B:
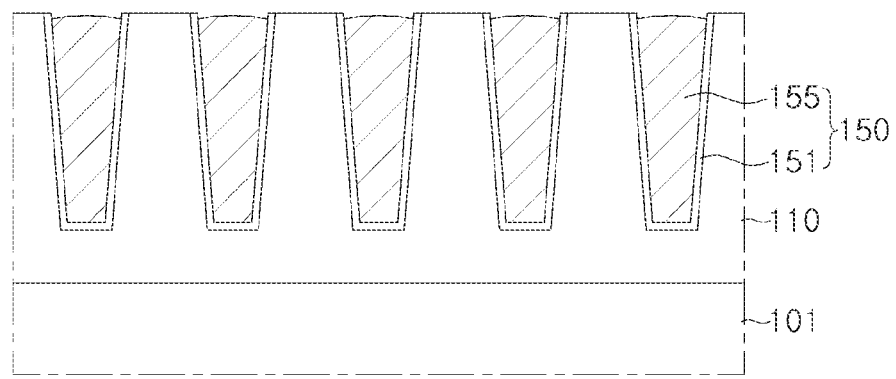

Referring to FIG. 8B, a process of planarizing the first barrier layer 151 and the first conductive material 155 may be performed until the upper surface of the first interlayer insulating layer 110 is exposed.

This planarization process may be performed down to, for example, the P1' level, and as a result, the lower wiring 150 may be formed in the first trench T1. The planarization process may include, for example, a chemical mechanical polishing (CMP) process and/or an etchback process.

The upper surface of the lower wiring 150 may have a substantially flat surface that is coplanar with the upper surface of the first interlayer insulating layer 110. However, a slightly different height may result depending on a material of the first barrier layer 151, the type of the first conductive material, and conditions of the planarization process. In some embodiments, the edge portion of the first conductive material 155 adjacent to the first barrier layer 151 may be formed lower than the center portion, as illustrated in FIG. 8A.

Figure 8C:
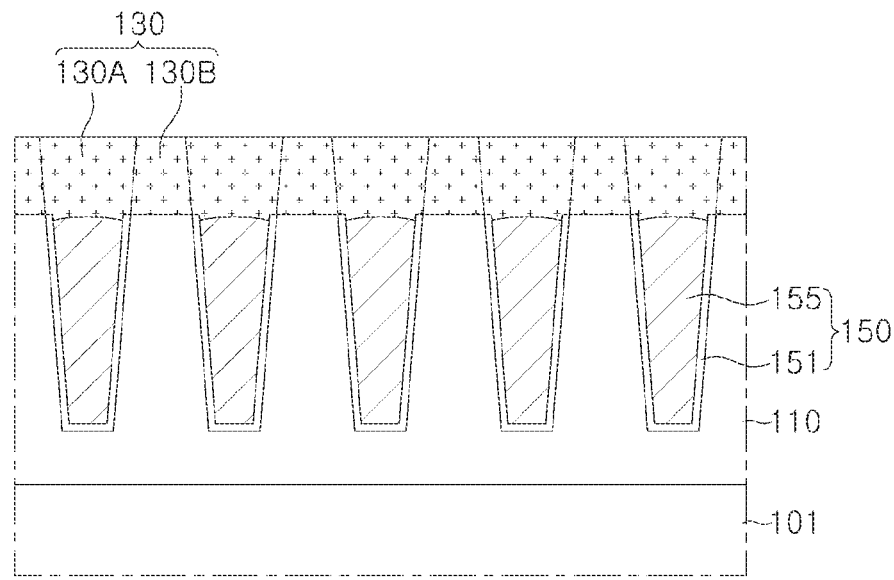

Referring to FIG. 8C, a self-alignment layer 130 may be formed on the first wiring 155 and the first interlayer insulating layer 110 using a direct self assembly process.

In some embodiments, the self-alignment layer 130 may be formed by applying a composition including a block copolymer (BCP) on the lower wiring 150 and the first interlayer insulating layer 110 by a spin coating process. The block copolymer may include two polymer units having different chemical properties. For example, the block copolymer may be synthesized by copolymerizing a first polymer unit and a second polymer unit by, for example, anionic polymerization or cationic polymerization. In some embodiments, the first polymer unit may have a stronger hydrophilicity than the second polymer unit.

Examples of the first polymer unit may include polymethylmethacrylate (PMMA), polydimethylsiloxane (PDMS), polyvinylpyrrolidone (PVP), polyethylene oxide (PEO), and polylactide (PLA) or polyimide (PI). An example of the second polymer unit may include Polystyrene (PS).

Accordingly, the block copolymer may be represented by PS-b-PMMA, PS-b-PDMS, PS-b-PVP, PS-b-PEO, PS-b-PLA, or PS-b-PI. Hereinafter, it will be described that the first polymer unit and the second polymer unit are PMMA and PS, respectively, and the block copolymer is represented by PS-b-PMMA in this example case. In this case, the block copolymer may include a first pattern 130A including PMMA and a second pattern 130B including PS.

In some embodiments, the first and second patterns 130A and 130B may be self-aligned on the upper surfaces of the lower wiring 150 and the first interlayer insulating layer 110, respectively. If the metal oxide film is removed from the upper surface of the lower wiring 150 in the preceding process during surface treatment, the first patterns 130A may be more easily arranged on the first wiring 155. In addition, in the previous process, when a hydrophobic high-concentration carbon region or a carbon-containing film is formed on the first interlayer insulating layer 110, the second patterns 130B may be more easily arranged on the first interlayer insulating layer 110.

Figure 8D:
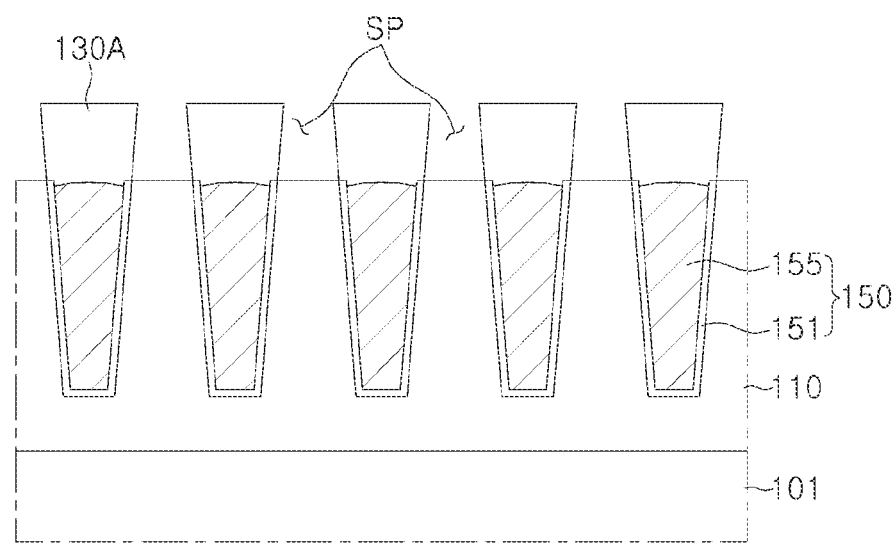

Subsequently, referring to FIG. 8D, the second pattern 130B may be removed from the self-alignment layer 130.

Through this process, a space SP where the first interlayer insulating layer 110 is exposed may be provided on the upper surface of the first interlayer insulating layer 110 and between adjacent second patterns 130B, for example, near the lower wiring 150. In some embodiments, the second pattern 130B may be removed by an additional strip process.

Figure 8E:
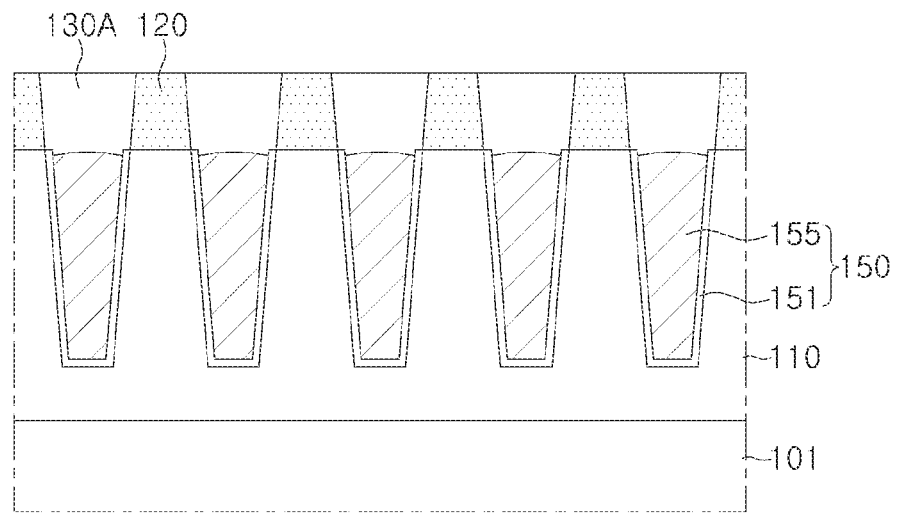

Referring to FIG. 8E, an insulating pattern 120 may be formed on the upper surface of the first interlayer insulating layer 110 within the open space SP.

In some embodiments, the insulating material layer filling the open space is formed on the exposed upper surface of the first interlayer insulating layer 110 and the upper surface of the first pattern 130A, and the insulating pattern 120 may be formed by planarizing the insulating material film until the upper surface of the first pattern 130A is exposed.

The insulating material layer may be formed through a flowable chemical vapor deposition (FCVD) process. In an example embodiment, the first insulating pattern 120 may include a material that is substantially the same as or similar to the lower first interlayer insulating layer 110. In this case, a high-concentration carbon region or a carbon-containing film on the first interlayer insulating layer 110 may also be included to distinguish the lower first interlayer insulating layer from the insulating pattern 120.

Figure 8F:
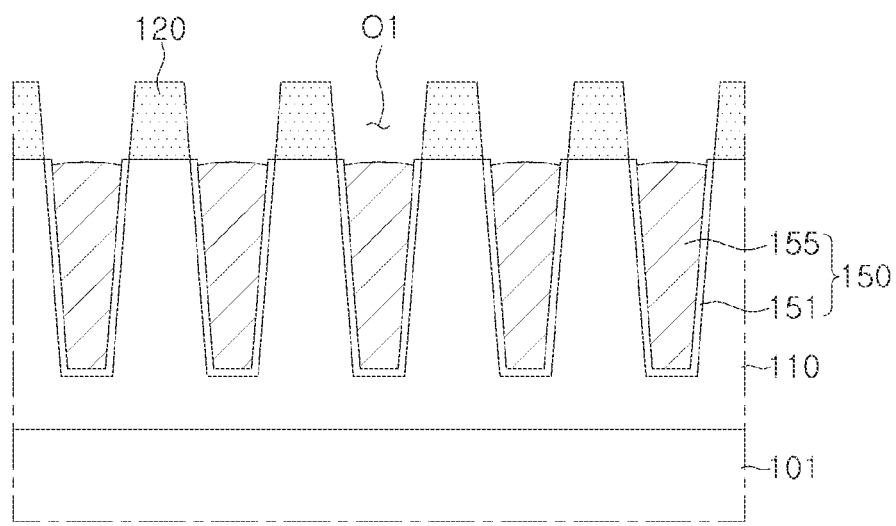

Referring to FIG. 8F, the insulating pattern 120 having the first opening O1 exposing the upper surface of the lower wiring 150 may be finally formed by removing the first pattern 130A. In some embodiments, the first pattern 130A may be removed by a curing and/or stripping process using ultraviolet rays.

Figure 9A:
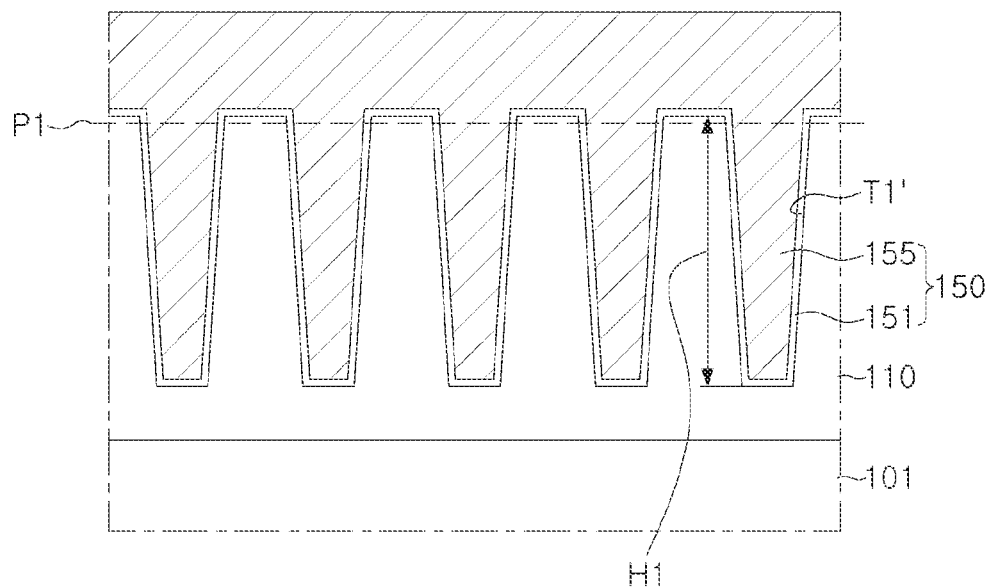
FIGS. 9A to 9C are cross-sectional views that illustrate respective major processes in a portion of a method of manufacturing a semiconductor device according to an example embodiment.
Figure 9B:
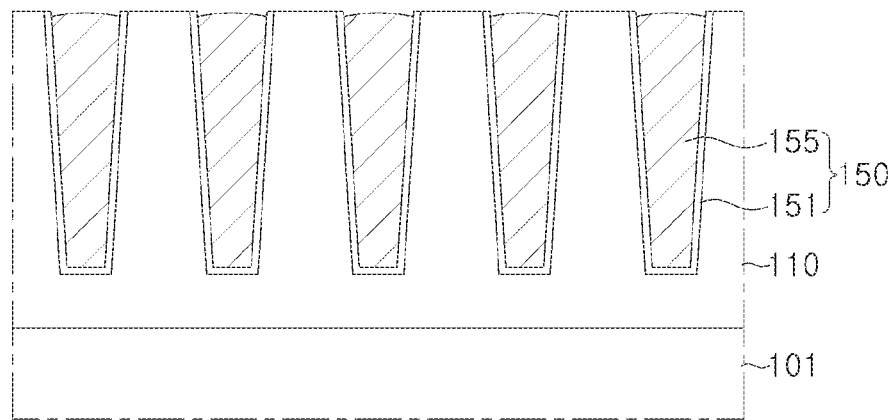
Figure 9C:
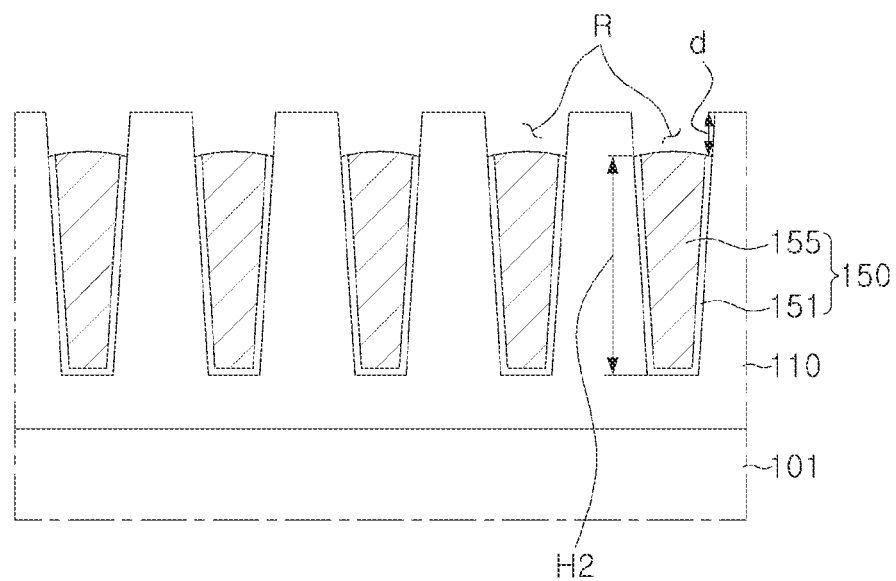

Through the above-described process, a substrate 101 having the lower wiring 150 and the insulating pattern 120 with the first opening O1 exposing the lower wiring 150 on the substrate 101 may be provided. Additionally, such a structure or similar structures may be obtained by performing other processes. FIGS. 9A to 9C are cross-sectional views that illustrate a respective major process in a portion of a method of manufacturing a semiconductor device according to an embodiment. The process according to an embodiment may be understood as a method of manufacturing the semiconductor device 500B illustrated in FIGS. 6 and 7.

Referring to FIG. 9A, after forming a first interlayer insulating layer 110 on a substrate 101 and removing the first interlayer insulating layer 110 to form a first trench T1', a first barrier layer 151 may be formed and a first conductive material 155 for the lower wiring 150 'may be filled in the first trench T1'.

This process is similar to the process illustrated in FIG. 8A, except in that the first trench T1' introduced in an embodiment has a different height from the first trench T1 of the previous embodiment. For example, the first trench T1 is formed to have a height H1 greater than a required height ("H2" in FIG. 9C) of the lower wiring 150. For example, the height of the first trench T1 may be designed in consideration of a depth d of the first opening to be obtained through a recess R in a subsequent process.

Referring to FIG. 9B, a process of planarizing the first barrier layer 151 and the first conductive material 155 may be performed until the upper surface of the first interlayer insulating layer 110 is exposed.

The planarization process may be performed down to a P1 level, and as a result, the lower wiring 150 may be formed in the first trench T1. Such planarization processes may include, for example, chemical mechanical polishing processes and/or etchback processes.

Referring to FIG. 9C, the recess R may be formed by removing the upper region of the lower wiring 150. The process of forming the recess R may be performed by removing the lower wiring 150 to a predetermined depth d by, for example, an etchback process. As described above, the first opening O1 that exposes the lower wiring 150 is not formed by a separately deposited pattern as in the previous embodiment, but may rather expose the lower wiring 150 through the recess R that is obtained by etching back the upper region of the lower wiring 150 in the first trench T1. This structure may secure a reduced distance between the via 240 and the lower wiring 150, similar to the insulating pattern 120 of the previous embodiment.

FIGS. 10A to 10F are cross-sectional views that illustrate major processes in another part of a method of manufacturing the semiconductor device 500 according to an example embodiment.

Figure 10A:
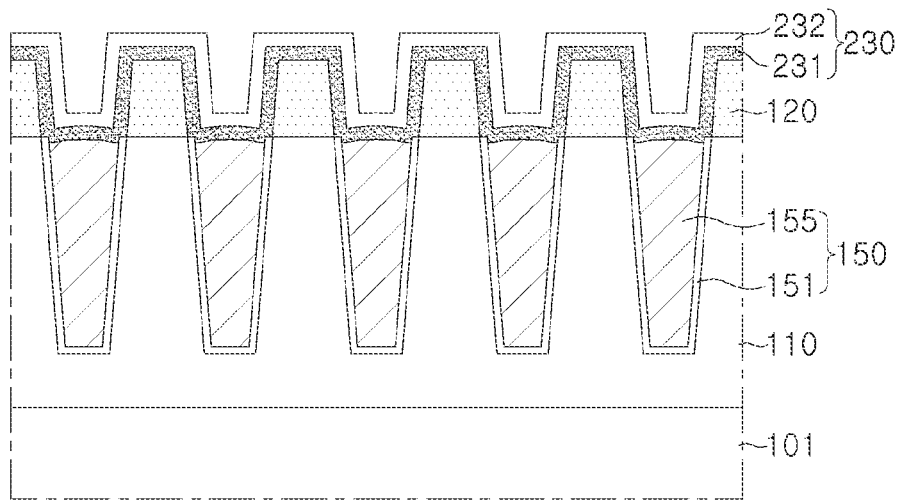
FIGS. 10A to 10F are cross-sectional views that illustrate major processes in another part of a method of manufacturing a semiconductor device according to an example embodiment.

Referring to FIG. 10A, in the structure manufactured according to FIG. 8F, a lower etch stop layer 231 and an upper etch stop layer 232 may be sequentially formed on the insulating pattern 120 and the lower wiring 150.

The lower etch stop layer 231 and the upper etch stop layer 232 may include different materials to have different etch selectivity. In some embodiments, the lower etch stop layer 231 may include an aluminum element, and the upper etch stop layer 232 may not include the aluminum element. For example, the lower etch stop layer 231 may include an aluminum compound such as aluminum oxide, aluminum nitride, aluminum oxynitride, or aluminum oxide carbide, and the upper etch stop layer 232 may include silicon oxide carbide, silicon oxynitride, or silicon carbide instead of the aluminum compound.

As described above, the etch stop layer 230 employed in an embodiment is comprised of only two layers, and thus, may have a relatively reduced thickness. In some embodiments, the total thickness of the double etch stop layer 230 may be 7 about nm or less, for example about 5 nm or less, which may prevent or reduce defects in a semiconductor device in which the lower wiring 150 has a fine width (e.g., about 15 nm or less).

Figure 10B:
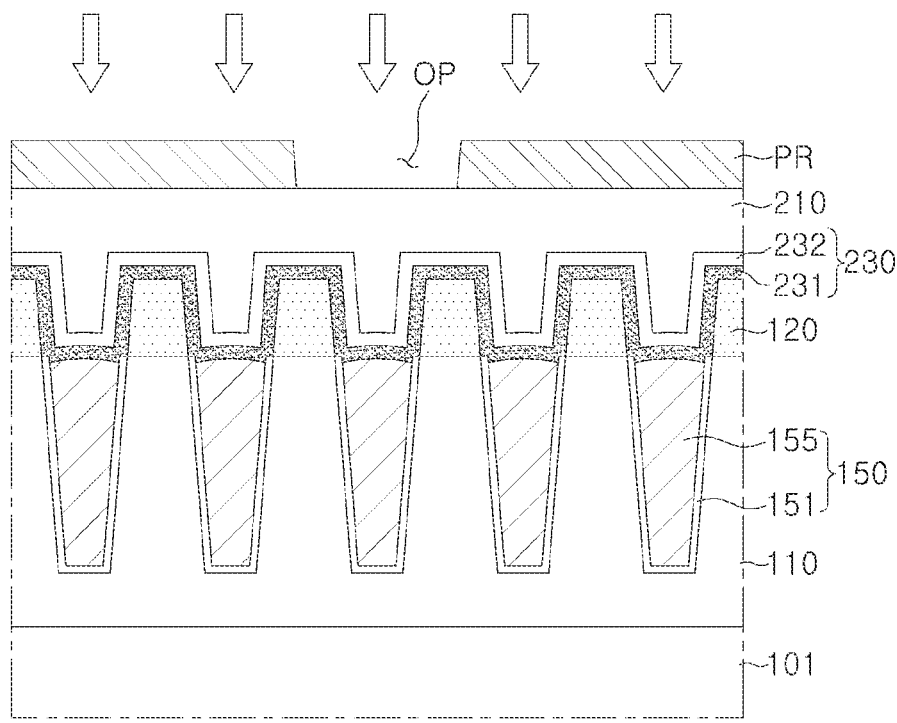

Referring to FIG. 10B, a second interlayer insulating layer 210 may be formed on the upper etch stop layer 232 and a hard mask pattern PR may be formed on the second interlayer insulating layer 210.

The second interlayer insulating layer 210 may include another material having an etch selectivity with respect to an upper etch stop pattern 232. The second interlayer insulating layer 210 may include at least one of, for example, silicon oxide, silicon nitride, silicon oxynitride, and a low dielectric constant material. The hard mask pattern PR may have an opening OP for forming a via hole VH. In some embodiments, the hard mask pattern PR may include a carbon-containing material. The hard mask pattern PR may include, for example, tungsten (WC) containing carbon.

Figure 10C:
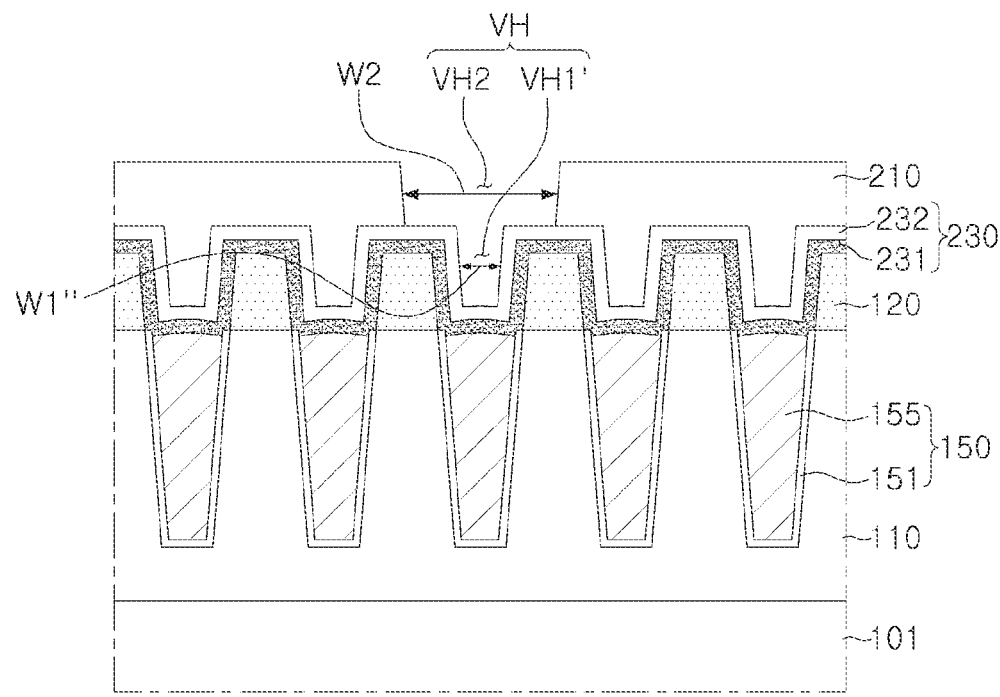

Referring to FIG. 10C, a first etching process for forming a via hole VH in the second interlayer insulating layer 210 using the hard mask pattern PR may be performed.

The via hole VH formed in this process defines a shape of a main region of a via ("240" in FIG. 10F) to be formed in a subsequent process, and may penetrate through the second interlayer insulating layer 210. During the first etching process, the hard mask pattern PR may also be removed. The hard mask pattern PR may also be removed while the via hole VH is formed during the etching process, by appropriately selecting the material and thickness of the hard mask pattern PR in consideration of the material and thickness of the second interlayer insulating layer 210. In this casean etch stop layer for the hard mask pattern PR may be omitted as well as the additional process performed to remove the hard mask pattern PR. Therefore, a TCR process may be performed using only the two-layered etch stop layer 230 according to an embodiment, instead of three-layered etch stop layer of the related art.

Figure 10D:
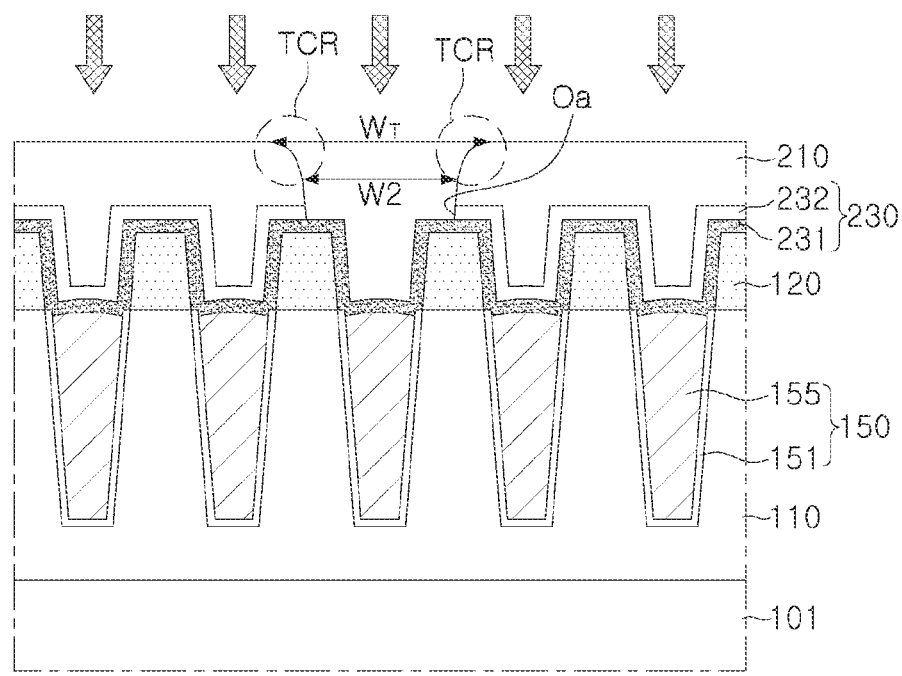

Referring to FIG. 10D, a second etching process may be performed so that the rounded top corner region TCR of the via hole VH is rounded in the second interlayer insulating layer 210.

During the second etching process, the region of the upper etch stop layer 232 exposed by the via hole VH may also be removed to form an upper etch stop pattern 232 having an opening Oa. As described above, the upper etch stop layer 232 may include silicon oxide carbide, silicon oxynitride, or silicon carbonitride. Accordingly, the upper etch stop layer 232 may be removed until the lower etch stop layer 231 is exposed in a wet etching process for round processing of the second interlayer insulating layer 210 similar thereto.

Figure 10E:
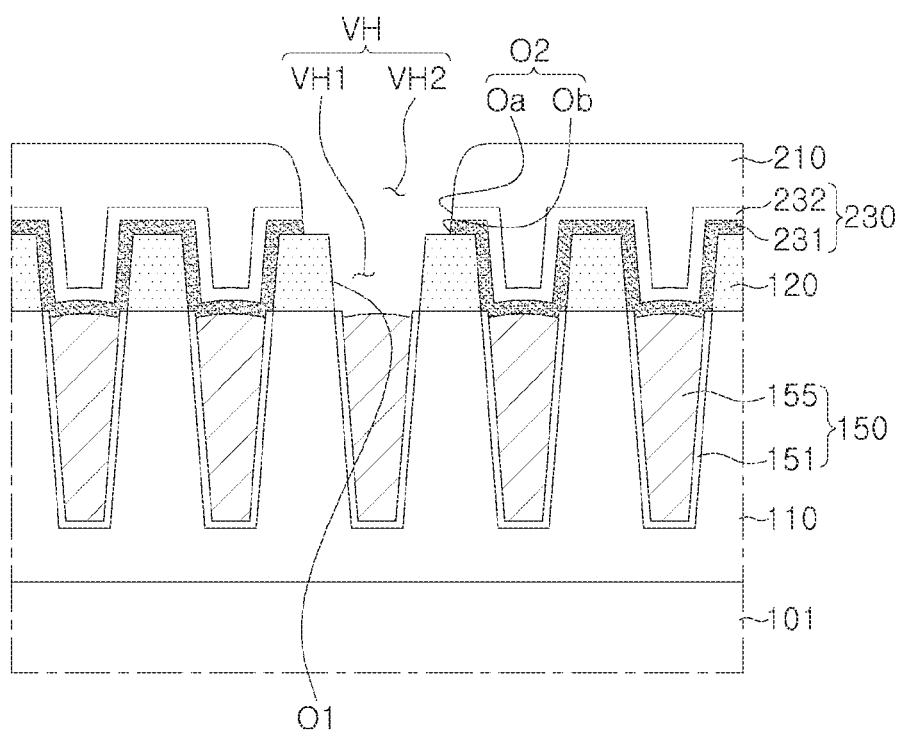

Referring to FIG. 10E, after the second etching process, a process of removing the region of the lower etch stop layer 231 exposed by the via hole VH may be performed.

This removal process may be performed by a cleaning process or a strip process. The area of the lower etch stop layer 231 exposed by the via hole VH may be removed to form a lower etch stop pattern 231 having an opening Ob. The openings of the lower etch stop pattern 231 and the upper etch stop pattern 232 may be substantially overlapped to provide a second opening O2. For example, in an embodiment, the lower etch stop patter n231 and the upper etch stop pattern 232 may vertically overlap to provide the opening O2. The second opening O2 may be connected to a region of the lower wiring 150 through the first opening O1. In an embodiment, the second opening O2 may be extended to open to an upper surface area of the insulating pattern 210 adjacent to the via 240.

Figure 10F:
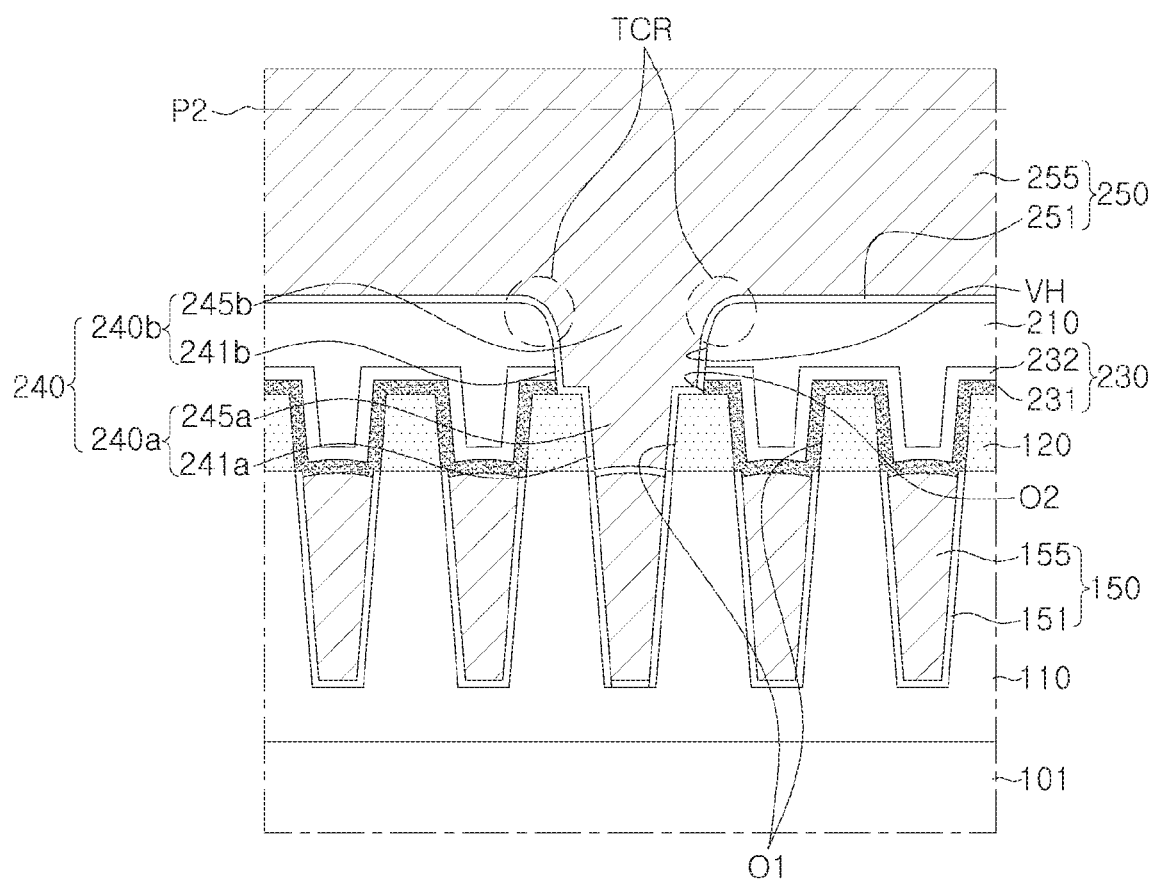

Referring to FIG. 10F, an upper wiring 250 with a via 240 connected to a portion of the lower wiring 150 through the via hole VH may be formed.

In some embodiments, the upper wiring 250 and the via 240 may be simultaneously formed using a dual damascene process. The upper wiring 250 and the via 240 may be formed by conformally forming second barrier layers 241a, 241b and 251 along the bottom and sidewalls of the via hole VH and a second trench T2, and filling the via hole VH and the second trench T2 with the second conductive materials 245a, 245b, and 255 on the second barrier layers 241a, 241b, and 251. For example, the second barrier layers 241a, 241b, 251 may include at least one of tantalum, tantalum nitride, titanium, titanium nitride, ruthenium, cobalt, nickel, nickel boron (NiB), and tungsten nitride. For example, the first conductive materials 245a, 245b, and 255 may include at least one of aluminum (Al), copper (Cu), tungsten (W), cobalt (Co), and combinations thereof.

Portions of the second barrier layer 251 and the second conductive material 255 may be removed down to the P2 level to be substantially coplanar with the upper surface of the second interlayer insulating layer 210, to form the required upper wiring 250 and via 240. In this planarization process, a relatively large region of the rounded top corner region around the upper surface of the second trench T2 may be removed. The rounded top corner regions of the via hole VH may also extend in the first direction (see D1 of FIG. 1), as illustrated in FIG. 10F.

Through the processes described herein, even when only two etch stop layers are used, a semiconductor device having an insulating pattern that secures a reduced distance between a via and a lower wiring and having a TCR structure that increases the reliability of a metal filling process may be manufactured.

As devices become more integrated, the spacing between circuit components such as wiring or the like is gradually reduced. In a comparative example, this may cause a defect in which current leaks between neighboring components, resulting in reduced performance or failure of the device. Embodiments of the present inventive concept may prevent or reduce leaks by ensuring a reduced distance between vias and wirings, as well as increasing fabrication process reliability.

As set forth above, according to example embodiments, despite the reduction in metal wiring critical dimension(s) (CD) involved in Back End of Line (BEOL) processes, a top corner rounding (TCR) structure that increases the reliability of a metal filling process may still be employed, together with an insulating pattern that secures a reduced distance between the metal via and the lower wiring while significantly reducing process reliability problems (e.g., unwanted filling of the first opening of the insulating pattern by the etch stop layer and/or generation of seams).

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
a substrate including an active region;
a first interlayer insulating layer disposed on the substrate;
a first wiring disposed in a plurality of trenches in the first interlayer insulating layer and electrically connected to the active region;
an insulating pattern disposed between adjacent trenches of the plurality of trenches on the first interlayer insulating layer and including a plurality of first openings, wherein the plurality of first openings expose the first wiring in the plurality of trenches, respectively;
a double etch stop layer including a lower etch stop pattern and an upper etch stop pattern,
wherein the lower etch stop pattern and the upper etch stop pattern are sequentially disposed on the insulating pattern and the first wiring such that the lower etch stop pattern directly contacts the first wiring, and
wherein the double etch stop layer includes a second opening that exposes a portion of the first wiring through one of the first openings and the lower etch stop pattern is spaced apart from the exposed portion of the first wiring;
a second interlayer insulating layer disposed on the upper etch stop pattern and including a via hole connected to the second opening, the via hole including a rounded top corner region;
a second wiring disposed in the via hole above the first wiring and within the second interlayer insulating layer; and
a via connecting the exposed portion of the first wiring and the second wiring to each other through the second opening and the via hole,
wherein the via has a first portion at least partially surrounded by the insulating pattern and a second portion located on the first portion and at least partially surrounded by the double etch stop layer and the second interlayer insulating layer, and
wherein a bottom of the first portion of the via includes a first stepped structure in which a width of the first portion is reduced from both side walls of the first portion that oppose each other.

2. The semiconductor device of claim 1, wherein a bottom of the second portion has a width greater than a width of a top of the first portion.

3. The semiconductor device of claim 2, wherein the via has a second stepped structure between the first portion and the second portion.

4. The semiconductor device of claim 3, wherein the via is at least partially surrounded by the double etch stop layer and contacts both of the lower and upper etch stop patterns, between the first portion and the second portion.

5. The semiconductor device of claim 4, wherein a portion of the double etch stop layer contacts a portion of an upper surface of the insulating pattern adjacent to the via.

6. The semiconductor device of claim 1, wherein a top corner of the insulating pattern has an angular structure, and wherein a top corner of the second interlayer insulating layer has a rounded structure.

7. The semiconductor device of claim 1, wherein the first wiring has a width of about 15 nm or less.

8. The semiconductor device of claim 1, wherein the lower etch stop pattern includes an aluminum element, and the upper etch stop pattern does not include the aluminum element.

9. The semiconductor device of claim 8, wherein the lower etch stop pattern includes at least one of aluminum oxide, aluminum nitride, aluminum oxynitride, or aluminum oxide carbide.

10. The semiconductor device of claim 8, wherein the upper etch stop pattern includes at least one of silicon oxide carbide, silicon oxynitride, or silicon carbon nitride.

11. The semiconductor device of claim 1, wherein the insulating pattern includes a material different from a material of the first interlayer insulating layer.

12. The semiconductor device of claim 1, wherein the insulating pattern includes the same material as a material of the first interlayer insulating layer.

13. The semiconductor device of claim 1, wherein the exposed portion of the first wiring includes a recessed portion recessed from a bottom surface of the insulating pattern towards the substrate, and
the first stepped structure fills a portion of the recessed portion.

14. A semiconductor device comprising:
a substrate including a first wiring, wherein the first wiring extends in a first direction;
an insulating pattern disposed on the substrate and including a first opening which exposes the first wiring;
a double etch stop layer including a lower etch stop pattern and an upper etch stop pattern sequentially stacked on the insulating pattern and the first wiring such that the lower etch stop pattern directly contacts the first wiring,
wherein the double etch stop layer includes a second opening which exposes a portion of the first wiring through the first opening,
wherein the lower etch stop pattern is spaced apart from the exposed portion of the first wiring, and
wherein a total thickness of the double etch stop layer is about 5 nm or less;
an interlayer insulating layer disposed on the upper etch stop pattern, wherein the interlayer insulating layer includes a via hole connected to the second opening, the via hole including a rounded top corner region;
a via connected to the exposed portion of the first wiring through the second opening and the via hole, wherein the via is disposed on an upper surface of the insulating pattern and has a first stepped structure; and
a second wiring disposed in the via hole above the first wiring and within the interlayer insulating layer, and extending in a second direction, wherein the second direction intersects the first direction,
wherein the via has a first portion at least partially surrounded by the insulating pattern and a second portion located on the first portion and at least partially surrounded by the double etch stop layer and the interlayer insulating layer, and
wherein a bottom of the first portion of the via includes a second stepped structure in which a width of the first portion is reduced from both side walls of the first portion that oppose each other.

15. The semiconductor device of claim 14, wherein a width of the first wiring in the first direction is about 15 nm or less.

16. The semiconductor device of claim 14, wherein the lower etch stop pattern includes aluminum oxide, and the upper etch stop pattern includes oxygen doped silicon carbide (ODC).

17. The semiconductor device of claim 14, wherein the exposed portion of the first wiring includes a recessed portion recessed from a bottom surface of the insulating pattern towards the substrate, and
the second stepped structure fills a portion of the recessed portion.

* * * * *